United States Patent [19]

Tajima

[11] Patent Number: 5,657,013

[45] Date of Patent: Aug. 12, 1997

[54] DATA RECORDING APPARATUS

[75] Inventor: Hiroshi Tajima, Kanagawa, Japan

[73] Assignee: Sony Corporation, Tokyo, Japan

[21] Appl. No.: 449,824

[22] Filed: May 24, 1995

[30] Foreign Application Priority Data

May 25, 1994 [JP] Japan .................... 6-111180

[51] Int. Cl.[6] .................................... H03M 5/00
[52] U.S. Cl. .................... 341/58; 341/68; 360/46
[58] Field of Search .................... 341/58, 59, 106, 341/68, 69; 360/46

[56] References Cited

U.S. PATENT DOCUMENTS

| 4,520,346 | 5/1985 | Shimada ................... 341/58 |
| 4,609,907 | 9/1986 | Adler et al. ............... 341/58 |
| 4,885,646 | 12/1989 | Kanota et al. ............ 360/46 |
| 5,122,912 | 6/1992 | Kanota et al. ............ 360/46 |
| 5,255,128 | 10/1993 | Inoue et al. ............. 360/40 |
| 5,432,651 | 7/1995 | Maeno et al. ............ 360/41 |

FOREIGN PATENT DOCUMENTS 4-74362  3/1992  Japan .

*Primary Examiner*—Jeffrey A. Gaffin
*Assistant Examiner*—Thuy-Trang N. Huynh
*Attorney, Agent, or Firm*—William S. Frommer; Alvin Sinderbrand

[57] ABSTRACT

An apparatus for encoding a digital signal includes switching means for alternately outputting the digital signal from first and second output terminals at every bit. A first converting means converts the digital signal output from the first output terminal to a signal which will be DC free after NRZI conversion is carried out. A second converting means converts the digital signal output from the second output terminal to a signal which will be DC free. An encoding means is supplied with outputs from the first and second converting means, alternately combining outputs of the first and second converting means at every bit and obtaining a substantially I-NRZI converted digital signal.

10 Claims, 4 Drawing Sheets

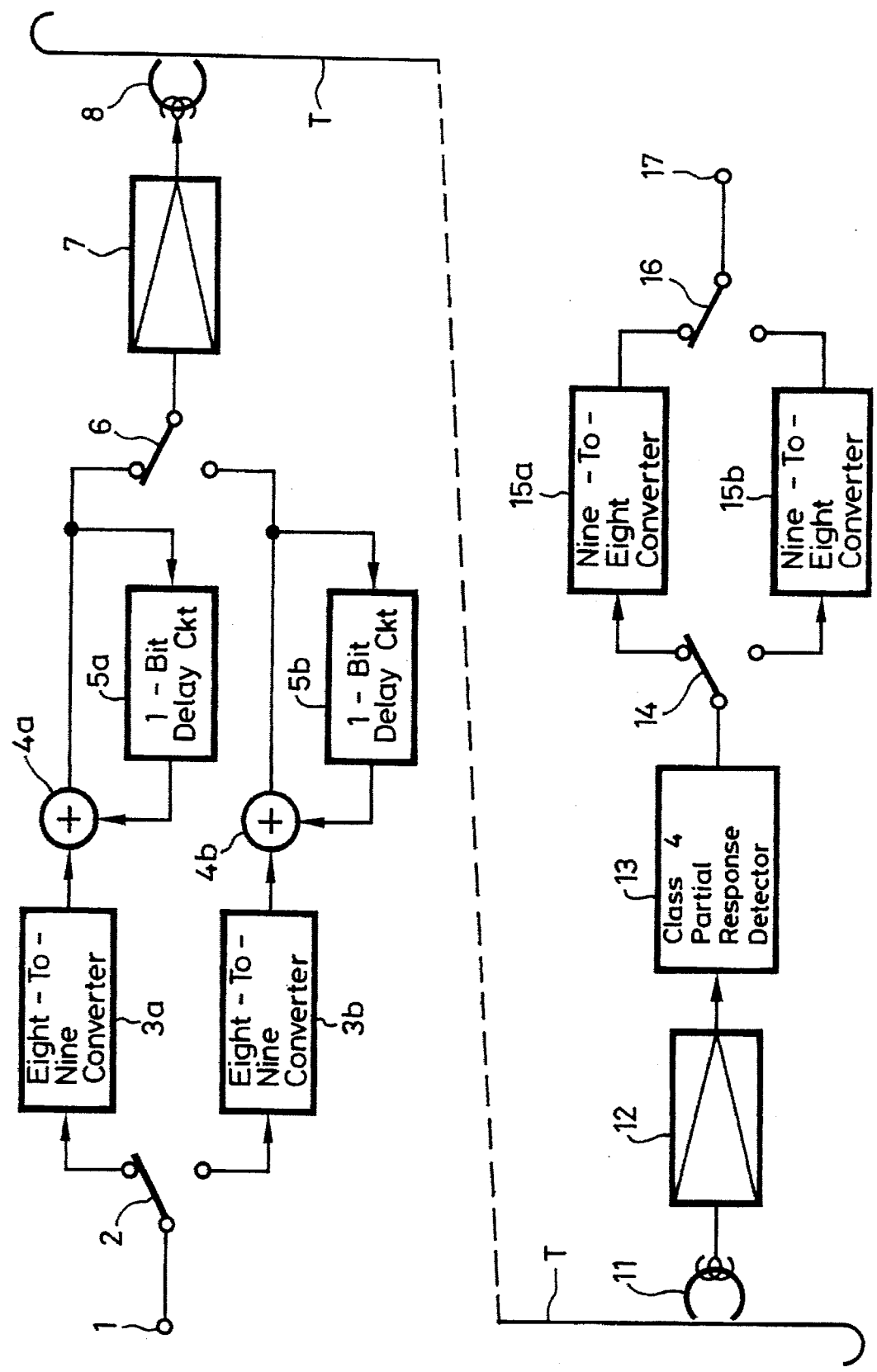

DATA RECORDING APPARATUS

BACKGROUND OF THE INVENTION

The present invention relates to a data recording method and, more particularly to an encoding method for use in a recording system in which a DC component is difficult to be reproduced, e.g., an encoding method for magnetically recording a data signal.

When a digital data signal is encoded, a precoding based on NRZI (non-return-to-zero inverted) conversion is carried out in order to avoid a propagation of error.

FIG. 1 of the accompanying drawings shows an example of such precoding based on NRZI conversion. As shown in FIG. 1, a digital data signal applied to an input terminal 21 is supplied to an adder (exclusive-OR circuit) 22 of which the output signal is supplied to an output terminal 23. The output from the adder 22 is also supplied to a 1-bit delay circuit 24, in which it is delayed by 1 bit and supplied to the adder 22. Therefore, an output signal shown on the lower row is obtained with respect to an input signal shown on the upper row of FIG. 2.

If the coding based on the NRZI is combined with a code conversion, such as an eight-to-nine conversion or the like, there is then obtained an encoded signal wherein the DC domponent of successive NRZI code words is minimized. Specifically, when the digital signal is encoded, there is obtained the encoded digital signal wherein a DSV (digital sum variation) obtained when +1 is assigned to symbol "1" and −1 is assigned to symbol "0" is constantly finite.

Since it is difficult to reproduce a DC component, when a coded signal is recorded on a magnetic medium, it is effective to obtain the encoded signal wherein the DC component of successive NRZI code words is minimized. In the NRZI conversion, if a code conversion such as an eight-to-nine (8/9) conversion or the like is combined with a preceding processing stage thereof, then there can be easily obtained the encoded signal wherein the DC component of successive NRZI code word is minimized. Therefore, the coded signal can be magnetically recorded satisfactorily.

U.S. Pat. No. 4,520,346 describes a technique in which a NRZI signal is converted to a DC-free signal.

In the encoding based on the NRZI conversion, it is possible to detect a code by using a partial response class 1. On the other hand, in the field of digital communication which is recently developed, a method for detecting a code using a partial response class 4 is used. Moreover, there has been established a detecting method with enhanced error correction ability, such as Viterbi decoding or the like.

When a code is detected by using the partial response class 4, precoding has to be carried out by I (interleaved)-NRZI conversion shown in FIG. 3.

As shown in FIG. 3, a digital data signal applied to an input terminal 41 is supplied through an adder (exclusive-OR circuit) 42 to an output terminal 43. An output signal of the adder 42 is supplied to 1-bit delay circuits 44, 45, in which it is delayed by 2 bits and supplied to the adder 42. Therefore, an output signal shown on the lower row in FIG. 4 is obtained with respect to an input signal shown on the upper row. Thus, a precoding based on the I-NRZI conversion is carried out.

In the I-NRZI conversion, a technique for converting a coded signal to a DC-free signal has not yet been realized. While the NRZI conversion can convert the coded signal to the DC-free signal with a cooperation of code conversion, such as eight-to-nine conversion provided at the preceding stage, the I-NRZI conversion cannot convert the coded signal to the DC free signal.

When a digital data signal is coded by a coding method based on the I-NRZI conversion in order to magnetically record a digital data signal, a DC component has to be suppressed by scrambling and randomizing or there has to be provided any means for reproducing a DC component. The above-mentioned method, however, needs extra circuit arrangements and cannot reproduce all codes.

SUMMARY OF THE INVENTION

In view of the aforesaid aspect, it is an object of the present invention to provide a data recording apparatus in which an encoded signal can be decoded with ease.

It is another object of the present invention to provide a data recording apparatus in which an encoded signal can be recorded on a magnetic medium satisfactorily.

According to a first aspect of the present invention, there is provided an apparatus for encoding a digital signal which is comprised of a switching means for alternately outputting the digital signal from first and second output terminals at every bit, a first converting means for converting the digital signal output from the first output terminal to a signal which will be DC free after NRZI conversion is carried out, a second converting means for converting the digital signal output from the second output terminal to a signal which will be DC free after NRZI conversion is carried out, and an encoding means supplied with outputs from the first and second converting means, alternately combining outputs of the first and second converting means at every bit and obtaining a substantially I-NRZI converted digital signal.

According to a second aspect of the present invention, there is provided an apparatus for decoding a digital signal which is comprised of a detecting means for detecting in a partial response class 4 a substantially I-NRZI converted digital signal, the I-NRZI converted digital signal being produced by alternately outputting digital signals from first and second output terminals of a switching means at every bit, converting by first and second converting means the digital signals output from the first and second output terminals into signals which will be DC free after NRZI conversion is carried out, and combining the converted digital signals alternately at every bit, a switching means for alternately outputting an output of the detecting means from third and fourth output terminals, a third converting means for converting the digital signal output from the third output terminal in a manner opposite to that of the first converting means, a fourth converting means for converting the digital signal output from the fourth output terminal in a manner opposite to that of the second converting means, and a combining means supplied with outputs of the third and fourth converting means and alternately combining the outputs of the third and fourth converting means at every bit.

According to a third aspect of the present invention, there is provided a method of encoding and decoding a digital signal which comprises the steps of (a) alternately outputting the digital signal from first and second output terminals at every bit, (b) converting the digital signals output from the first and second output terminals to a signal which will be DC free after NRZI conversion is carried out, (c) alternately combining the two digital signals obtained in step (b) and obtaining substantially an I-NRZI converted digital signals, (d) detecting the digital signals obtained in step (c) by a partial response class 4, (e) alternately outputting the digital signals obtained in step (c) from third and fourth output terminals at every bit, (f) converting the digital signals output from the third and fourth output terminals in a manner opposite to that of the step (b), and (g) alternately combining the two digital signals obtained in the step (f) at every bit.

BRIEF DESCRIPTION OF THE DRAWINGS

FIG. 6 is a block diagram showing an arrangement of a coding circuit according to an embodiment of the present invention.

DETAILED DESCRIPTION OF THE PREFERRED EMBODIMENTS

The present invention will now be described with reference to the drawings.

Figure 1:
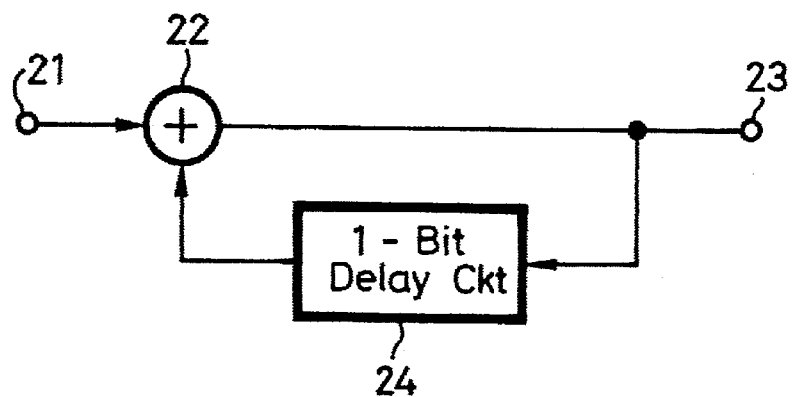
FIG. 1 is a schematic block diagram showing an arrangement of a conventional circuit for carrying out NRZI conversion.
Figure 2:
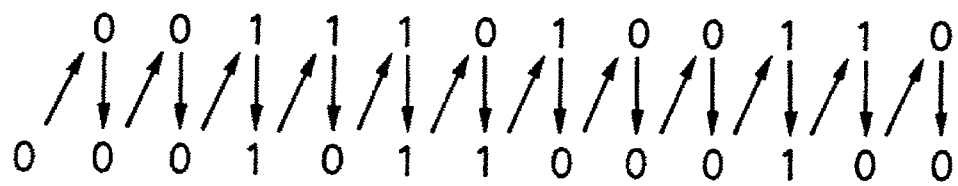
FIG. 2 is a diagram used to explain the NRZI conversion shown in FIG. 1.
Figure 3:
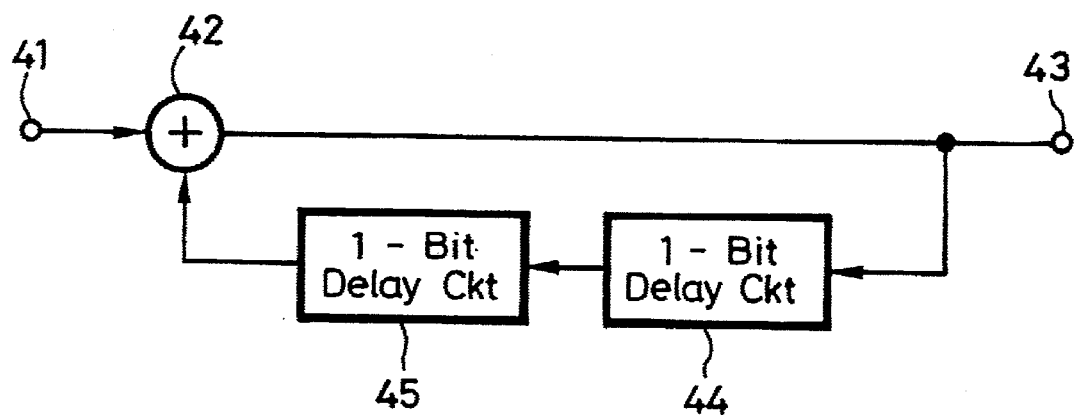
FIG. 3 is a block diagram showing an arrangement of a conventional circuit for carrying out I-NRZI conversion.
Figure 4:
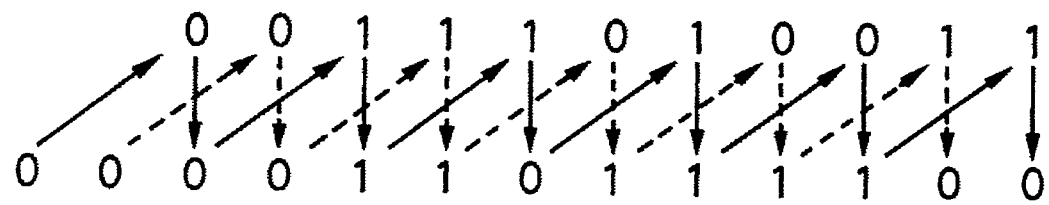
FIG. 4 is a diagram used to explain the I-NRZI shown in FIG. 3.
Figure 5A:
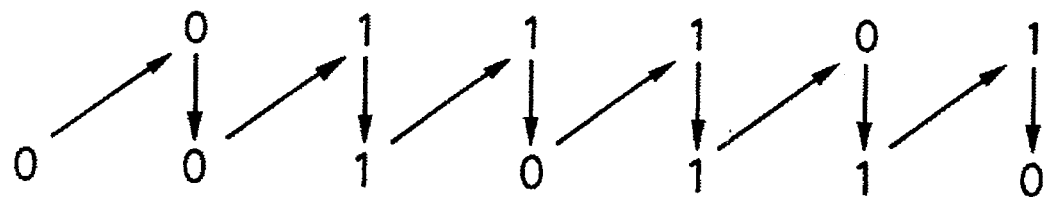
FIGS. 5A and 5B are diagrams used to explain I-NRZI conversion.
Figure 5B:
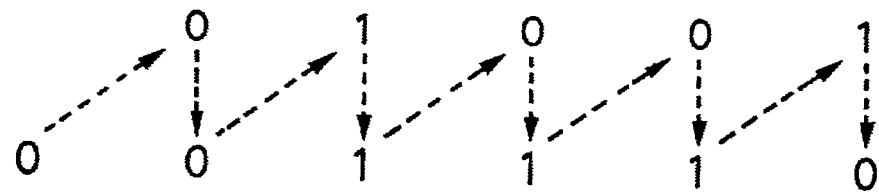

The I-NRZI conversion shown in FIG. 4 is effected by adding preceding two data. As shown by solid lines and dotted lines in FIG. 4, when an input signal and an output signal are separated into two sets at every bit, respective groups are presented as shown in FIGS. 5A and 5B. Having examined the input signal and the output signal shown in FIGS. 5A and 5B, the input signal and the output signal are equivalent to those that are processed by the NRZI conversion.

As shown in FIG. 6, a digital signal to be recorded is supplied to an input terminal 1 as an 8-bit serial signal. The digital signal from the input terminal 1 is supplied to a switch 2, in which it is divided to two sets at every bit. Divided digital signals are respectively supplied to eight-to-nine converting circuits 3a, 3b, in which they are converted so as to become DC-free signals after having been processed by the NRZI conversion.

The digital signals converted by the eight-to-nine converting circuits 3a, 3b are supplied to adders 4a, 4b, respectively. The adders 4a, 4b are formed of exclusive-OR circuits because a carry is not required in actual practice. The digital signals from the adders 4a, 4b are fed through 1-bit delay circuits 5a, 5b back to the adders 4a, 4b, respectively. Thus, the adders 4a, 4b output NRZI-converted digital signals, respectively.

The digital signals respectively output from the adders 4a, 4b are supplied to a switch 6, in which they are alternately combined at every bit. Since the NRZI-converted signals are alternately combined at every bit by the switch 6, the switch 6 outputs a coded signal equivalent to the digital signal obtained by the I-NRZI conversion.

Specifically, when the digital signal of bits $a_0 a_1 a_2 a_3 a_4 a_5 \ldots$ is supplied to the input terminal 1, for example, this digital signal is supplied to and divided by the switch 2. Thus, the switch 2 outputs digital signals of bits $a_0 a_2 a_4, \ldots, a_1 a_3 a_5, \ldots$. These digital signals are supplied to the eight-to-nine converters 3a, 3b, in which they are converted to digital signals of bits $b_0 b_2 b_4, \ldots, b_1 b_3 b_5 \ldots$.

These digital signals are further converted by the NRZI and thereby formed as digital signals of bits $c_0 c_2 c_4 \ldots, c_1 c_3 c_5 \ldots$. These digital signals are DC-free signals in which each DSV is finite. Then, when these digital signals are supplied to and alternately combined at every bit by the switch 6, the switch 6 outputs a digital signal of bits $c_0 c_1 c_2 c_3 c_4 c_5 \ldots$ which is a DC-free signal in which a DSV thereof is finite.

The digital signals that had been converted by the eight-to-nine converting circuits 3a, 3b are respectively converted by the NRZI so that resulting digital signals become NRZI converted digital signals whereat a DC component is minimized. Since these digital signals converted by the NRZI are combined alternately at every bit by the switch 6, they become the encoded signal equivalent to the digital signal which is DC-free and obtained by the I-NRZI conversion.

According to the above encoding circuit, there are provided two sets of code-conversion circuits for converting a digital signal to a signal which will be DC free after NRZI conversion is carried out. The digital signal is divided at every bit to two sets. The divided digital signals are respectively supplied to the code-conversion circuits and the converted digital signals are alternately combined at every bit. Thus, it is possible to obtain an I-NRZI converted signal which is DC free.

The digital signal from the switch 6 is supplied through a recording amplifier 7 to a recording head 8 and thereby recorded on a magnetic tape T. A signal recorded on the magnetic tape T is reproduced by a reproducing head 11. A reproduced signal from the reproducing head 11 is supplied through a playback amplifier 12 to a class 4 partial response detecting circuit 13 formed of a proper means, such as a so-called Viterbi decoder or the like.

The detecting circuit 13 outputs a digital signal which results from decoding the I-NRZI converted digital signal. A digital signal from the detecting circuit 13 is supplied to a switch 14, in which it is divided to two sets at every bit. Then, the divided digital signals are supplied to nine-to-eight converting circuits 15a, 15b, whereat they are converted in a manner opposite to that of the above eight-to-nine converting circuits 3a, 3b.

The digital signals that had been converted by the nine-to-eight converting circuits 15a, 15b are supplied to a switch 16, in which they are alternately combined at every bit. Therefore, the switch 16 outputs a digital signal which results from reconverting the two sets of divided digital signals. This digital signal is supplied to an output terminal 17.

Specifically, the reproducing head 11 reproduces the signal of $c_0 c_1 c_2 c_3 c_4 c_5 \ldots$ from the magnetic tape T. This reproduced signal is supplied to the class 4 partial response detecting circuit 13 formed of a suitable means, such as a Viterbi decoder. Thus, the detecting circuit 13 outputs the digital signal of $b_0 b_1 b_2 b_3 b_4 b_5 \ldots$ Then, the switch 14 divides this digital signal to provide digital signals of $b_0 b_2 b_4 \ldots$ and $b_1 b_3 b_5 \ldots$. These digital signals are supplied to the nine-to-eight converting circuits 15a, 15b which derive the digital signals of $a_0 a_2 a_4 \ldots, a_1 a_3 a_5 \ldots$. These digital signals are supplied to and alternately selected by the switch 16. Thus, the digital signals of $a_0 a_1 a_2 a_3 a_4 a_5 \ldots$ are supplied to the output terminal 17.

In other words, the reproduced signal from the reproducing head 11 is detected by the class 4 partial response detecting circuit 13 formed of a suitable means, such as a Viterbi decoder. The detected digital signal is divided by the switch 14 and supplied to the nine-to-eight converting circuits 15a, 15b, in which they are converted and supplied to the switch 16. These digital signals supplied to the switch 16 are alternately selected and supplied to the output terminal 17.

Figure 7:
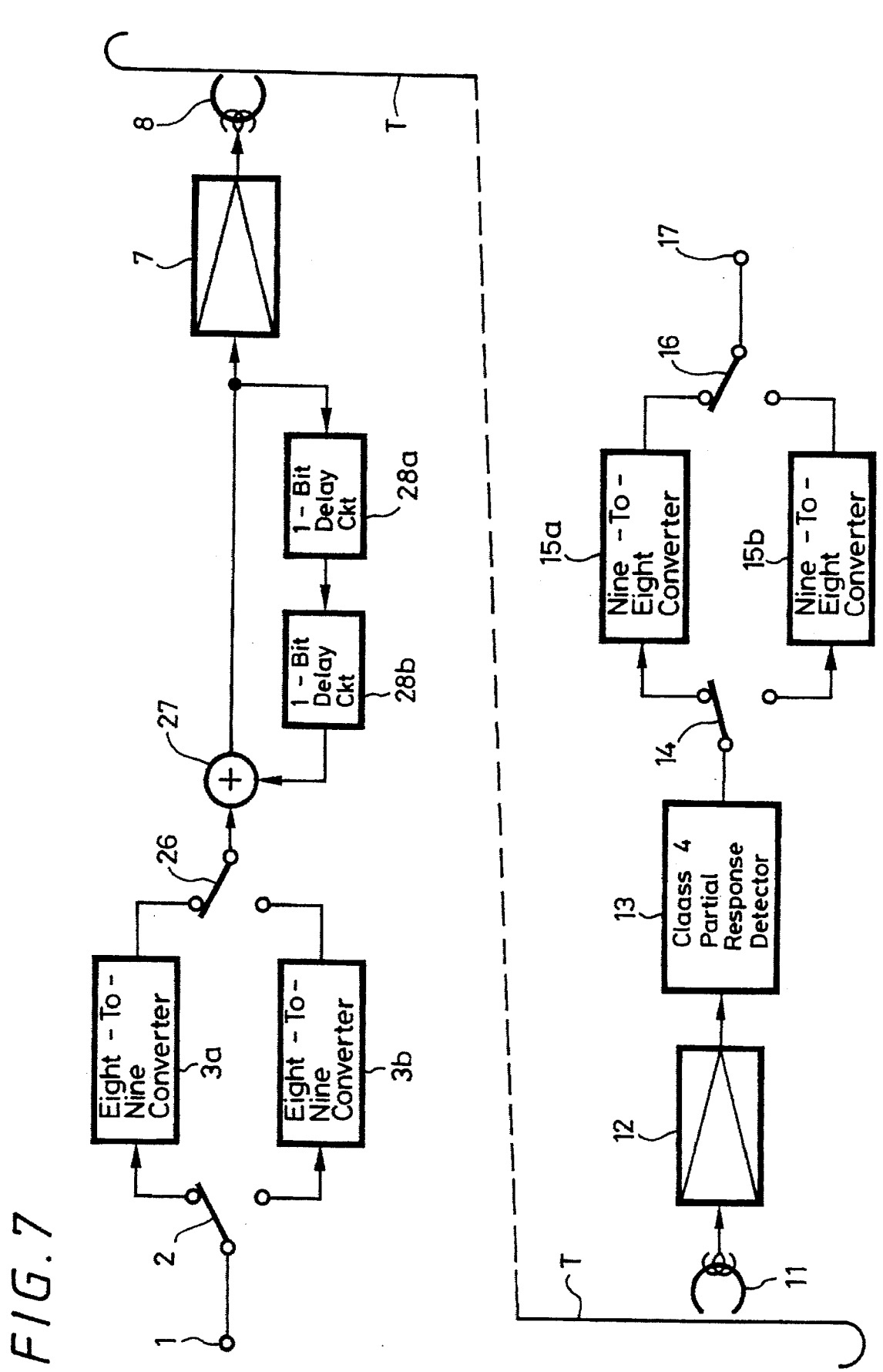
FIG. 7 is a block diagram showing an arrangement of a coding circuit according to another embodiment of the present invention.

A second embodiment of the present invention will be described with reference to FIG. 7. In FIG. 7, like elements and parts identical to those of FIG. 6 are marked with the same references and therefore need not be described in detail. The second embodiment shown in FIG. 7 is different from the first embodiment shown in FIG. 6 in that the adders 4a, 4b, the 1-bit delay circuits 5a, 5b and the change-over switch 6 are replaced with a change-over switch 26, an adder 27 and 1-bit delay circuits 28a, 28b.

Specifically, the digital signals from the eight-to-nine converting circuits 3a, 3b are supplied to the change-over switch 26 which outputs a digital signal in which the digital signals are selected and combined at every bit. The digital signal from the change-over switch 26 is supplied to the adder 27. An output of the adder 27 is supplied through the 1-bit delay circuits 28a, 28b to the adder 27, in which it is added with the digital signal supplied thereto from the change-over switch 26. Therefore, a precoding based on the I-NRZI conversion is carried out. A circuit composed of the adders 4a, 4b, the 1-bit delay circuits 5a, 5b and the change-over switch 6 shown in FIG. 6 is equivalent to the circuit composed of the change-over switch 26, the adder 27 and the 1-bit delay circuits 28a, 28b shown in FIG. 7. Therefore, also in accordance with this embodiment, it is possible to obtain the encoded signal which is DC free similarly to the first embodiment shown in FIG. 6.

As described above, according to the above encoding method, the encoded signal is detected by the class 4 partial response, such as so-called Viterbi decoder or the like. Then, the detected signal is separated into two groups at every bit. The signals thus separated are supplied to the inverse conversion means of the encoding means. The signals thus processed by the inverse conversion means are alternately combined at every bit, whereby the above-mentioned encoded signal can be decoded with ease.

Further, since the above-mentioned encoded signal is DC free, the encoded signal can be recorded on a magnetic medium satisfactorily.

The signal thus magnetically recorded is reproduced and the encoded signal thus reproduced is detected by using the class 4 partial response. Then, the detected signal is separated into two groups at every bit. The signals thus separated are supplied to the inverse conversion means of the encoding means and the signals thus processed by the inverse conversion means are combined alternately at every bit, thereby making it possible to obtain the output signal from the encoded signal thus reproduced.

In the above encoding method, the code conversion in which the digital signal becomes a signal which will be DC free after NRZI conversion is carried out is not limited to the eight-to-nine conversion and an eight-to-ten conversion can be used. The present invention can be applied to any code conversion so long as the digital signal becomes a signal which will be DC free after NRZI conversion is carried out.

According to the present invention, there are provided the two sets of the code conversion means for converting the digital signal which will be DC free after NRZI conversion is carried out. The input signal is separated into two sets of signals at every bit. The signals thus separated are respectively supplied to the code conversion means. The converted signals are alternately combined at every bit, and the encoded signal which is DC free can be obtained by the I-NRZI conversion.

The above encoded signal is detected by the class 4 partial response, such as a so-called Viterbi decoder or the like. The detected signal is separated into two sets of signals at every bit. The signals thus separated are respectively supplied to the inverse conversion means of the code conversion means. The signals thus processed by the inverse code conversion means are alternately combined at every bit, thereby making it possible to decode the above encoded signal with ease.

Further, since the encoded signal is DC free, this encoded signal can be recorded on the magnetic medium satisfactorily.

Furthermore, the signal thus magnetically recorded is reproduced and the encoded signal thus reproduced is detected by using the class 4 partial response. Then, the detected signal is separated into the two sets of signals at every bit. The signals thus separated are supplied to the inverse conversion means of the code conversion means. The signals thus processed by the inverse conversion means are alternately combined at every bit, thereby making it possible to decode the reproduced encoded signal with ease.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. An apparatus for encoding a digital signal comprising:

switching means for alternately outputting said digital signal from first and second output terminals at every bit;

first converting means for converting said digital signal output from said first output terminal to a signal which will be DC free after NRZI conversion is carried out;

second converting means for converting said digital signal output from said second output terminal to a signal which will be DC free after NRZI conversion is carried out; and encoding means supplied with outputs from said first and second converting means, alternately combining outputs of said first and second converting means at every bit and obtaining a substantially I-NRZI converted digital signal.

2. An apparatus for encoding a digital signal according to claim 1, wherein said encoding means is comprised of switching means for alternately outputting the outputs of said first and second converting means at every bit;

an exclusive-OR circuit supplied with an output of said switching means as an input thereof; and a delay circuit for delaying an output of said exclusive-OR circuit by 2 bits and outputting a delayed output to said exclusive-OR circuit as another input.

3. An apparatus for encoding a digital signal according to claim 1, wherein said encoding means is composed of a first exclusive-OR circuit supplied with an output of said first converting means as an input, a first delay circuit for delaying an output of said first exclusive-OR circuit by one bit and outputting a delayed output to said first exclusive-OR circuit as another input, a second exclusive-OR circuit supplied with an output of said second converting means as an input, a second delay circuit for delaying an output of said second exclusive-OR circuit by one bit and outputting a delayed output to said second exclusive-OR circuit as another input, and switching means for alternately outputting outputs of said first and second exclusive-OR circuits at every bit.

4. An apparatus for recoding & decoding a digital signal comprising:

detecting means for detecting in a partial response class 4 a substantially I-NRZI converted digital signal, said I-NRZI converted digital signal being produced by alternately outputting digital signals from first and second output terminals of first switching means at every bit, converting by first and second converting means said digital signals output from said first and second output terminals into signals which will be DC free after NRZI conversion is carried out, and combining the converted digital signals alternately at every bit;

second switching means for alternately outputting an output of said detecting means from third and fourth output terminals;

third converting means for converting said digital signal output from said third output terminal in a manner opposite to that of said first converting means;

fourth converting means for converting said digital signal output from said fourth output terminal in a manner opposite to that of said second converting means; and combining means supplied with outputs of said third and fourth converting means and alternately combining the outputs of said third and fourth converting means at every bit.

5. A method for encoding a digital signal comprising the steps of:

(a) alternately outputting said digital signal from first and second output terminals at every bit;

(b) converting said digital signals output from said first and second output terminals to a signal which will be DC free after NRZI conversion is carried out after step (a);

(c) alternately combining two outputs obtained in step (b) at every bit and obtaining substantially an I-NRZI converted digital signal.

6. A method for encoding a digital signal according to claim 5, wherein said step (c) is comprised of the steps of alternately combining two digital signals obtained in step (b) at every bit and I-NRZI converting combined digital signals.

7. A method for encoding a digital signal according to claim 5, wherein said step (c) is comprised of the steps of NRZI converting said two digital signals obtained in step (b) and alternately outputting two digital signals subjected to the NRZI conversion at every bit.

8. A method of encoding and decoding a digital signal comprising the steps of:

(a) alternately outputting said digital signal from first and second output terminals at every bit;

(b) converting said digital signals output from said first and second output terminals to a signal which will be DC free after NRZI conversion is carried out;

(c) alternately combining said two digital signals obtained in step (b) and obtaining substantially I-NRZI converted digital signals;

(d) detecting said digital signals obtained in step (c) by a partial response class 4;

(e) alternately outputting said digital signals obtained in step (c) from third and fourth output terminals at every bit;

(f) converting said digital signals output from said third and fourth output terminals in a manner opposite to that of said step (b); and (g) alternately combining said two digital signals obtained in said step (f) at every bit.

9. A method of encoding and decoding a digital signal according to claim 8, wherein said steps (c) and (d) include therebetween the steps of recording said digital signals obtained in said step (c) on a recording medium and reproducing said digital signals recorded on said recording medium.

10. A method of encoding and decoding a digital signal according to claim 9, wherein said recording medium is a magnetic recording medium.

* * * * *